United States Patent
Lu et al.

(10) Patent No.: US 12,088,063 B2
(45) Date of Patent: Sep. 10, 2024

(54) PHOTONIC CRYSTAL SURFACE-EMITTING LASER

(71) Applicants: Interface Technology (ChengDu) Co., Ltd., Sichuan (CN); Interface Optoelectronics (ShenZhen) Co., Ltd., Guangdong (CN); General Interface Solution Limited, Miaoli County (TW)

(72) Inventors: Tien-Chang Lu, Guangdong (CN); Kuo-Bin Hong, Guangdong (CN); Lih-Ren Chen, Guangdong (CN); Ten-Hsing Jaw, Guangdong (CN)

(73) Assignees: Interface Technology (ChengDu) Co., Ltd., Sichuan (CN); Interface Optoelectronics (ShenZhen) Co., Ltd., Guangdong (CN); General Interface Solotion Limited, Miaoli County (TW)

( * ) Notice: Subject to any disclaimer, the term of this patent is extended or adjusted under 35 U.S.C. 154(b) by 623 days.

(21) Appl. No.: 17/446,971

(22) Filed: Sep. 6, 2021

(65) Prior Publication Data

US 2023/0044996 A1   Feb. 9, 2023

(30) Foreign Application Priority Data

Aug. 9, 2021   (CN) .......................... 202110909231.4

(51) Int. Cl.
*H01S 5/11* (2021.01)
*H01S 5/042* (2006.01)
*H01S 5/185* (2021.01)
*H01S 5/343* (2006.01)

(52) U.S. Cl.
CPC ............ *H01S 5/11* (2021.01); *H01S 5/04256* (2019.08); *H01S 5/185* (2021.01); *H01S 5/343* (2013.01)

(58) Field of Classification Search
None
See application file for complete search history.

(56) References Cited

U.S. PATENT DOCUMENTS 10,340,659 B1 * 7/2019 Lin ..................... H01S 5/18394
2007/0201527 A1 * 8/2007 Hori ..................... H01S 5/18333
372/102

* cited by examiner

*Primary Examiner* — Tuan N Nguyen
(74) *Attorney, Agent, or Firm* — CKC & Partners Co., LLC

(57) ABSTRACT

A photonic crystal surface-emitting laser includes a substrate, an n-type cladding layer, an active layer, an index matching layer and a photonic crystal structure. The n-type cladding layer is disposed over the substrate. The active layer is disposed over the n-type cladding layer. The index matching layer is disposed over the n-type cladding layer and is arranged around the active layer. The index matching layer is electrically insulating, and an effective refractive index of the index matching layer is substantially identical to an effective refractive index of the active layer. The photonic crystal structure is disposed over the active layer and the index matching layer.

20 Claims, 8 Drawing Sheets

PHOTONIC CRYSTAL SURFACE-EMITTING LASER

RELATED APPLICATIONS

This application claims priority to China Application Serial Number 202110909231.4, filed Aug. 9, 2021, the disclosure of which is incorporated herein by reference in its entirety.

BACKGROUND

Technical Field

The present disclosure relates to a photonic crystal surface-emitting laser.

Description of Related Art

Lasers are widely used in different fields such as medicine, optical communication and industrial processing. However, convention lasers have drawbacks such as large divergence angle and large threshold current. This problem remains to be solved.

SUMMARY

In view of the foregoing, one of the objects of the present disclosure is to provide a photonic crystal surface-emitting laser with small divergence angle and small threshold current.

To achieve the objective stated above, in accordance with an embodiment of the present disclosure, a photonic crystal surface-emitting laser includes a first substrate, an n-type cladding layer, an active layer, an index matching layer and a photonic crystal structure. The n-type cladding layer is disposed over the first substrate. The active layer is disposed over the n-type cladding layer. The index matching layer is disposed over the n-type cladding layer and is arranged around the active layer. The index matching layer is electrically insulating, and an effective refractive index of the index matching layer is substantially identical to an effective refractive index of the active layer. The photonic crystal structure is disposed over the active layer and the index matching layer.

In one or more embodiments of the present disclosure, the index matching layer is transparent to light emitted by the active layer.

In one or more embodiments of the present disclosure, a lateral length of the active layer is smaller than a lateral length of the photonic crystal structure.

In one or more embodiments of the present disclosure, a cross-sectional area of the active layer is smaller than a cross-sectional area of the photonic crystal structure.

In one or more embodiments of the present disclosure, the active layer is located in an orthogonal projection area of the photonic crystal structure onto the n-type cladding layer.

In one or more embodiments of the present disclosure, the index matching layer is at least partially located in an orthogonal projection area of the photonic crystal structure onto the n-type cladding layer.

In one or more embodiments of the present disclosure, a lateral length of the active layer is within a range from 6 to 10 micrometers.

In one or more embodiments of the present disclosure, the index matching layer is in contact with a side surface of the active layer.

In one or more embodiments of the present disclosure, the active layer further has a top surface and a bottom surface. The top surface faces the photonic crystal structure. The bottom surface faces the n-type cladding layer. The side surface is connected between the top surface and the bottom surface. The index matching layer is spaced apart from the top surface and the bottom surface of the active layer.

In one or more embodiments of the present disclosure, the active layer is cylindrical.

In one or more embodiments of the present disclosure, the photonic crystal surface-emitting laser further includes an electron blocking layer disposed over the active layer and the index matching layer.

In one or more embodiments of the present disclosure, the photonic crystal surface-emitting laser further includes a p-type cladding layer and a second substrate. The p-type cladding layer is disposed over the photonic crystal structure. The second substrate is disposed over the p-type cladding layer.

In one or more embodiments of the present disclosure, the photonic crystal surface-emitting laser further includes a metal electrode. The metal electrode is disposed on a side of the second substrate away from the p-type cladding layer, and the metal electrode is in contact with a surface of the second substrate away from the p-type cladding layer.

In one or more embodiments of the present disclosure, the photonic crystal surface-emitting laser further includes a transparent conductive layer disposed over the photonic crystal structure.

In one or more embodiments of the present disclosure, the photonic crystal surface-emitting laser further includes a metal electrode. The metal electrode is disposed on a side of the transparent conductive layer away from the photonic crystal structure, and the metal electrode is in contact with a surface of the transparent conductive layer away from the photonic crystal structure.

In one or more embodiments of the present disclosure, the photonic crystal surface-emitting laser further includes a metal electrode. The metal electrode is disposed on a side of the first substrate away from the n-type cladding layer, and the metal electrode is in contact with a surface of the first substrate away from the n-type cladding layer.

In one or more embodiments of the present disclosure, the photonic crystal structure includes a plurality of periodic holes.

In one or more embodiments of the present disclosure, the first substrate, the n-type cladding layer and the active layer are arranged along a direction, and the periodic holes are arranged on a plane normal to the direction.

In one or more embodiments of the present disclosure, the periodic holes have circular, quadrangular or hexagonal cross-sections.

In one or more embodiments of the present disclosure, the active layer includes quantum well.

In sum, the photonic crystal surface-emitting laser of the present disclosure includes an index matching layer arranged around the active layer. The index matching layer is electrically insulating, and an effective refractive index of the index matching layer is substantially identical to an effective refractive index of the active layer. By this arrangement, the photonic crystal surface-emitting laser of the present disclosure can have smaller divergence angle and smaller threshold current.

BRIEF DESCRIPTION OF THE DRAWINGS

To make the objectives, features, advantages, and embodiments of the present disclosure, including those mentioned above and others, more comprehensible, descriptions of the accompanying drawings are provided as follows.

DETAILED DESCRIPTION

Figure 1B:
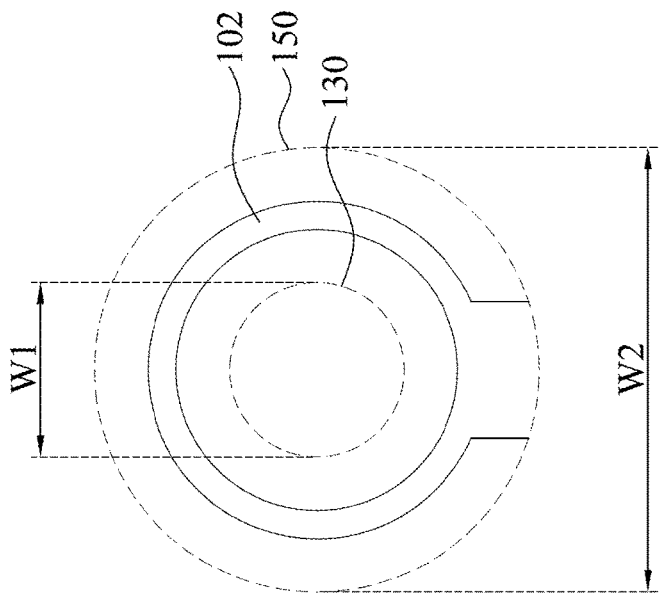
FIG. 1B illustrates an enlarged perspective view of the photonic crystal surface-emitting laser shown in FIG. 1A in the area M.

For the completeness of the description of the present disclosure, reference is made to the accompanying drawings and the various embodiments described below. Various features in the drawings are not drawn to scale and are provided for illustration purposes only. To provide full understanding of the present disclosure, various practical details will be explained in the following descriptions. However, a person with an ordinary skill in relevant art should realize that the present disclosure can be implemented without one or more of the practical details. Therefore, the present disclosure is not to be limited by these details.

Figure 1A:
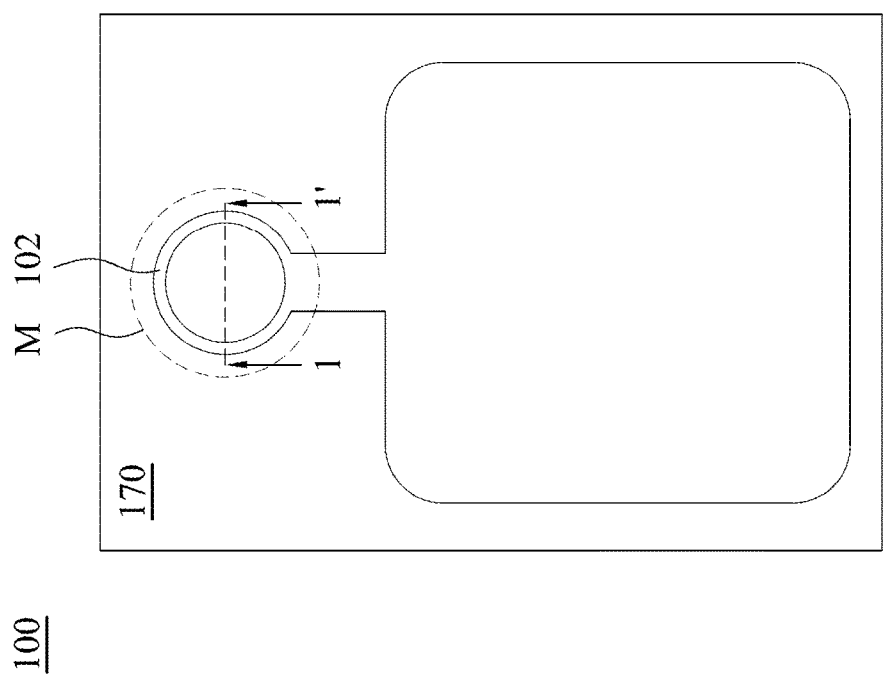
FIG. 1A illustrates a top view of a photonic crystal surface-emitting laser in accordance with an embodiment of the present disclosure.
Figure 1C:
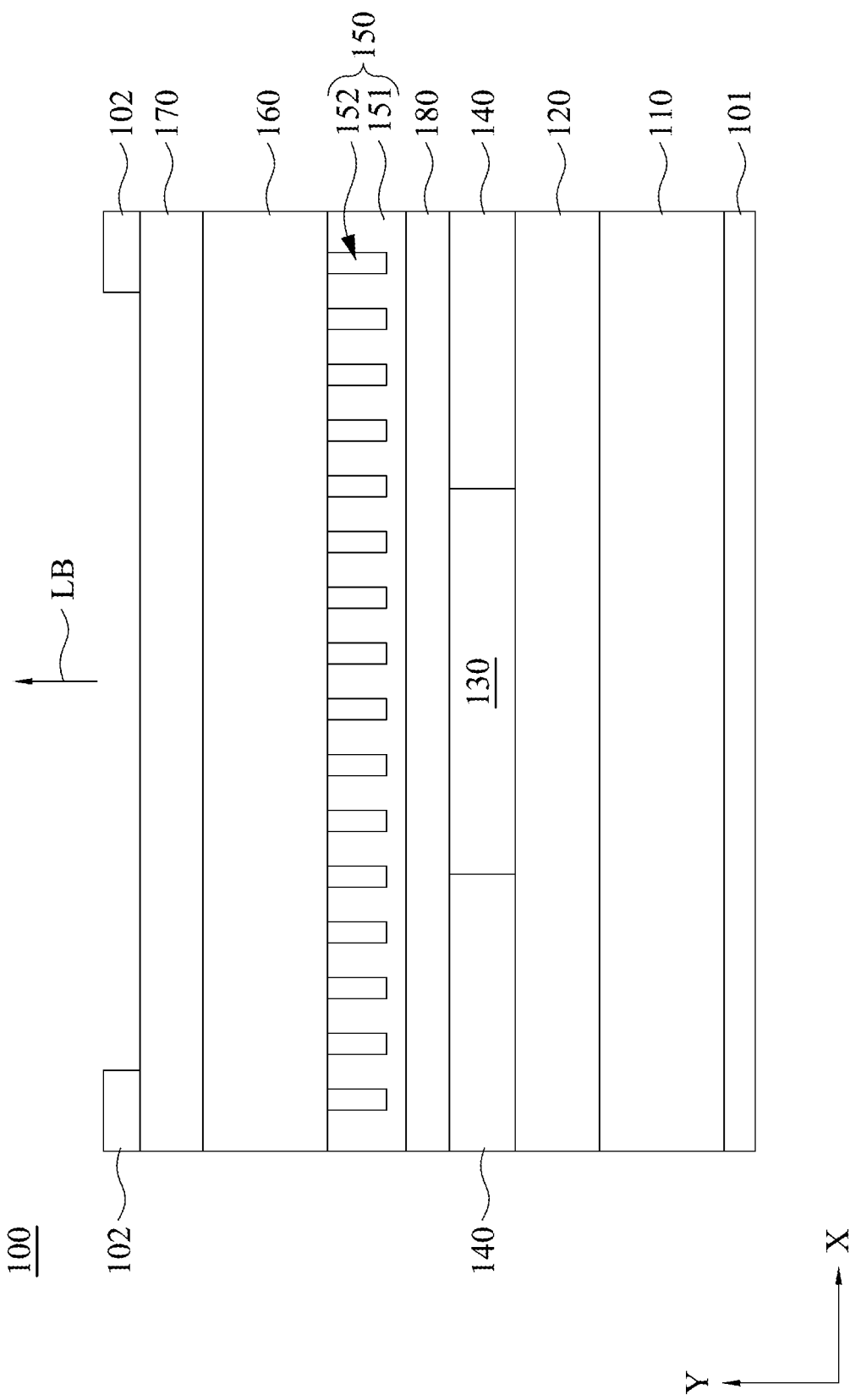
FIG. 1C illustrates a sectional view of the photonic crystal surface-emitting laser shown in FIG. 1A taken along line segment 1-1'.

Reference is made to FIGS. 1A to 1C. FIG. 1A illustrates a top view of a photonic crystal surface-emitting laser 100 in accordance with an embodiment of the present disclosure. FIG. 1B illustrates an enlarged perspective view of the photonic crystal surface-emitting laser 100 shown in FIG. 1A in the area M. FIG. 1C illustrates a sectional view of the photonic crystal surface-emitting laser 100 shown in FIG. 1A taken along line segment 1-1'. The photonic crystal surface-emitting laser 100 includes a first substrate 110, an n-type cladding layer 120, an active layer 130, an index matching layer 140, a photonic crystal structure 150, a p-type cladding layer 160, and a second substrate 170 in a stack arrangement along a first direction Y. The first substrate 110 is, for example, a semiconductor substrate, which may include GaAs or other suitable semiconductor material. The n-type cladding layer 120 is disposed over the first substrate 110. The active layer 130 and the index matching layer 140 are disposed over the n-type cladding layer 120. In some embodiments, the active layer 130 includes quantum well and is configured to emit light when a voltage is applied to the photonic crystal surface-emitting laser 100.

In some embodiments, the n-type cladding layer 120 may include GaAs, InGaAs, InGaAsP, AlAs, AlGaInAs, AlGaInP, AlGaAs, InGaNAs, GaAsSb, GaSb, InP, InAs, GaP, AlP, GaN, AlGaN, InGaN, AlInGaN, other suitable semiconductor material, or any combination thereof.

As shown in FIGS. 1A to 1C, the photonic crystal structure 150 is disposed over the active layer 130 and the index matching layer 140. The light emitted by the active layer 130 can resonate in the photonic crystal structure 150 and thereby produce a laser beam LB. The laser beam LB is output from the top of the photonic crystal surface-emitting laser 100 along the first direction Y.

As shown in FIGS. 1A to 1C, in some embodiments, the photonic crystal structure 150 includes a base portion 151 and a plurality of periodic holes 152. The base portion 151 may include GaAs or other suitable semiconductor material. The periodic holes 152 are formed on a side of the base portion 151 that is away from the active layer 130 and the index matching layer 140. The periodic holes 152 are arranged in a second direction X substantially normal to the first direction Y. In some embodiments, the periodic holes 152 are arranged on a plane normal to the first direction Y. In some embodiments, the periodic holes 152 have circular, quadrangular or hexagonal cross-sections.

As shown in FIGS. 1A to 1C, the p-type cladding layer 160 is disposed over the photonic crystal structure 150, and the second substrate 170 is disposed over the p-type cladding layer 160. The second substrate 170 may include p-type semiconductor material such as p-GaAs.

In some embodiments, the p-type cladding layer 160 may include GaAs, InGaAs, InGaAsP, AlAs, AlGaInAs, AlGaInP, AlGaAs, InGaNAs, GaAsSb, GaSb, InP, InAs, GaP, AlP, GaN, AlGaN, InGaN, AlInGaN, other suitable semiconductor material, or any combination thereof.

As shown in FIGS. 1A to 1C, the index matching layer 140 is arranged around the active layer 130. In some embodiments, the active layer 130 is cylindrical. The active layer 130 takes the shape of a circular disk in top view. The index matching layer 140 is spaced apart from a bottom surface of the active layer 130 (i.e., the surface of the active layer 130 facing the n-type cladding layer 120) and a top surface of the active layer 130 (i.e., the surface of the active layer 130 facing the photonic crystal structure 150), and is in contact with a side surface of the active layer 130 (i.e., the surface of the active layer 130 connected between the top surface and the bottom surface). The index matching layer 140 is electrically insulating, such that electric current only passes through the active layer 130 when a voltage is applied to the photonic crystal surface-emitting laser 100. The index matching layer 140 does not emit light and does not absorb light. In addition, an effective refractive index of the index matching layer 140 is substantially identical to an effective refractive index of the active layer 130. By this arrangement, the photonic crystal surface-emitting laser 100 of the present disclosure can have smaller divergence angle and smaller threshold current.

In some embodiments, the index matching layer 140 includes dielectric material. In some embodiments, the index matching layer 140 includes non-conductive or high-impedance semiconductor material (e.g., undoped semiconductor material, or doped semiconductor material such as GaN doped with Fe). In some embodiments, the index matching layer 140 is transparent to the light emitted by the active layer 130.

As shown in FIGS. 1A to 1C, in some embodiments, a cross-sectional area of the active layer 130 (specifically, the area of the cross-section of the active layer 130 that is normal to the first direction Y) is smaller than a cross-sectional area of the photonic crystal structure 150 (specifically, the area of the cross-section of the photonic crystal structure 150 that is normal to the first direction Y). When a voltage is applied to the photonic crystal surface-emitting laser 100, the electric current passes through the active layer 130 of smaller size, but laser can be emitted from the photonic crystal structure 150 of greater size, resulting in an enlarged emission area. In some embodiments, a ratio of the cross-sectional area of the index matching layer 140 to the cross-sectional area of the active layer 130 is within a range from 1.5 to 100.

As shown in FIGS. 1A to 1C, in some embodiments, a lateral length W1 of the active layer 130 is smaller than a lateral length W2 of the photonic crystal structure 150, in which "lateral length" refers to the length in the second direction X. In some embodiments, the lateral length W1 of the active layer 130 is within a range from 6 to 10 micrometers. In the embodiments where the active layer 130 is cylindrical, the lateral length W1 is equivalent to the diameter of the active layer 130.

As shown in FIGS. 1A to 1C, in some embodiments, the active layer 130 is located in an orthogonal projection area of the photonic crystal structure 150 onto the n-type cladding layer 120, in which "orthogonal projection area" refers to the area of projection along the opposite direction of the first direction Y. In some embodiments, the index matching layer 140 is at least partially located in the orthogonal projection area of the photonic crystal structure 150 onto the n-type cladding layer 120.

As shown in FIGS. 1A to 1C, in some embodiments, the photonic crystal surface-emitting laser 100 further includes an electron blocking layer 180 covering the active layer 130 and the index matching layer 140. The electron blocking layer 180 is disposed between the photonic crystal structure 150 and the active layer 130/the index matching layer 140.

As shown in FIGS. 1A to 1C, in some embodiments, the photonic crystal surface-emitting laser 100 further includes a first electrode 101 and a second electrode 102. The first electrode 101 is disposed on a side of the first substrate 110 away from the n-type cladding layer 120, and the first electrode 101 is in contact with a surface of the first substrate 110 away from the n-type cladding layer 120. The second electrode 102 is disposed on a side of the second substrate 170 away from the p-type cladding layer 160, and the second electrode 102 is in contact with a surface of the second substrate 170 away from the p-type cladding layer 160. In some embodiments, the first and second electrodes 101 and 102 are metal electrodes. In some embodiments, the second electrode 102 includes a ring structure. The ring structure has a central opening configured to allow the laser beam LB to pass through.

In some embodiments, the first and second electrodes 101 and 102 may include In, Sn, Al, Au, Pt, Zn, Ge, Ag, Pb, Pd, Cu, AuBe, BeGe, Ni, PbSn, Cr, AuZn, Ti, W, TiW, other suitable electrically conductive material, or any combination thereof.

A method for manufacturing the photonic crystal surface-emitting laser 100 will be described below with reference to FIGS. 2 to 6.

Reference is made to FIGS. 2 to 6, which illustrate sectional views of the photonic crystal surface-emitting laser 100 of FIG. 1C at various stages of manufacturing. The method for manufacturing the photonic crystal surface-emitting laser 100 includes step S1 to S11.

Figure 2:
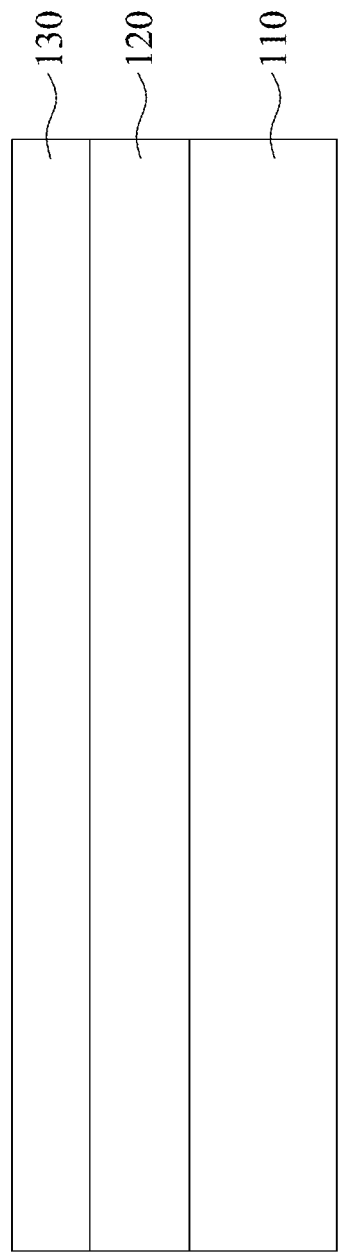
FIGS. 2-6 illustrate sectional views of the photonic crystal surface-emitting laser of FIG. 1C at various stages of manufacturing.

As shown in FIG. 2, the method for manufacturing the photonic crystal surface-emitting laser 100 begins at step S1, which includes forming the first substrate 110, the n-type cladding layer 120 and the active layer 130. The first substrate 110, the n-type cladding layer 120 and the active layer 130 are in a stack arrangement along the first direction Y. The active layer 130 covers a top surface of the n-type cladding layer 120. In some embodiments, step S1 includes forming the first substrate 110, the n-type cladding layer 120 and the active layer 130 by means of epitaxial growth.

Figure 3:
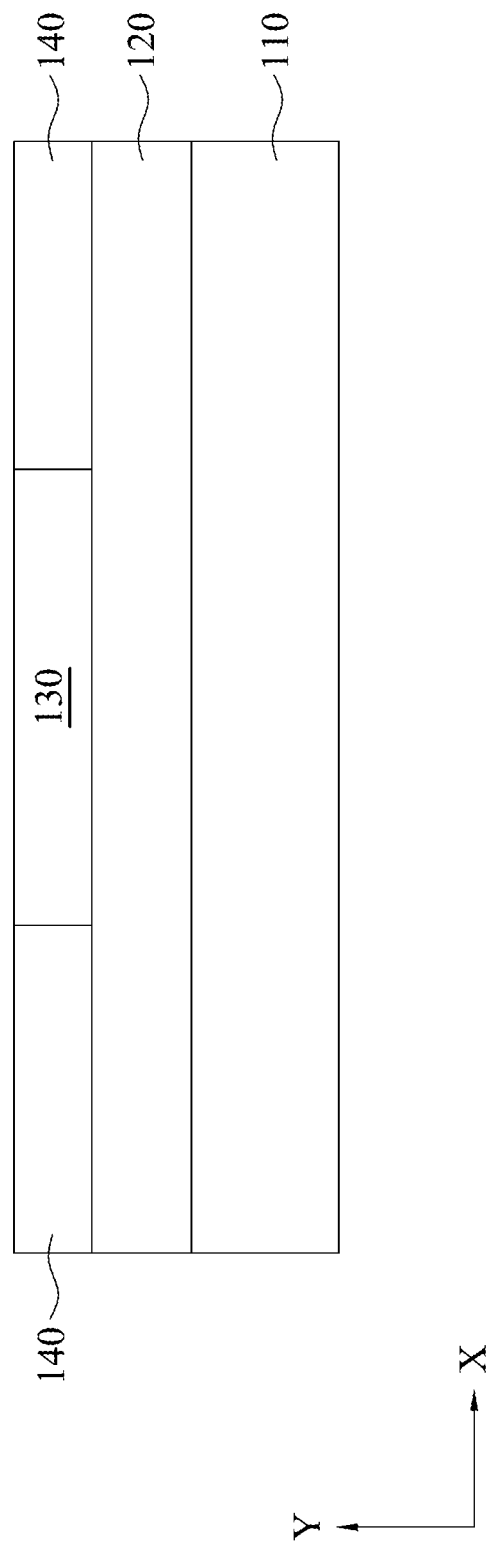

As shown in FIG. 3, the method for manufacturing the photonic crystal surface-emitting laser 100 continues to step S3, which includes forming the index matching layer 140 around the active layer 130. In some embodiments, step S3 includes etching the peripheral region of the active layer 130 formed in step S1 and then forming the index matching layer 140 around the active layer 130 by means of epitaxial growth. In some embodiments, step S3 includes carrying out a quantum well intermixing process to the active layer 130 to form the index matching layer 140.

Figure 4:
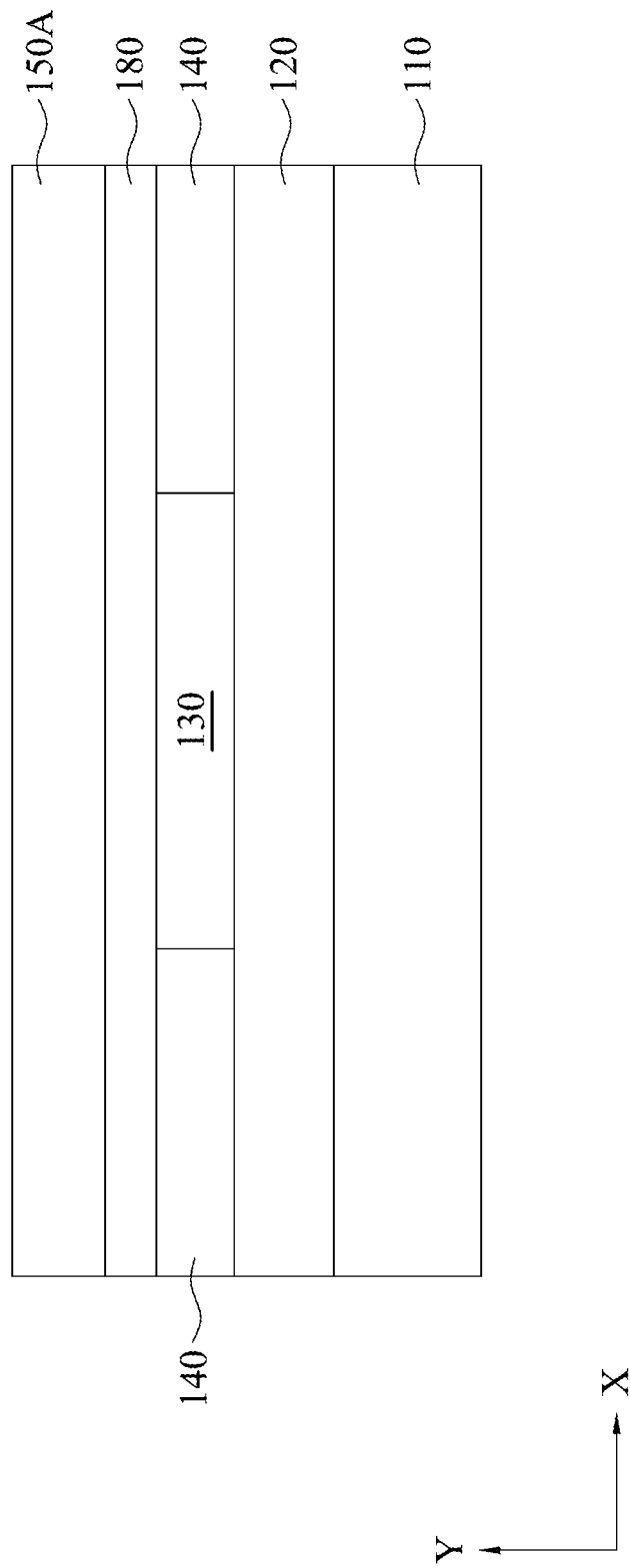

As shown in FIG. 4, the method for manufacturing the photonic crystal surface-emitting laser 100 continues to step S5, which includes forming the electron blocking layer 180 and a semiconductor layer 150A (e.g., p-GaAs) over the active layer 130 and the index matching layer 140. The electron blocking layer 180 and the semiconductor layer 150A are in a stack arrangement along the first direction Y. The semiconductor layer 150A covers a top surface of the electron blocking layer 180. In some embodiments, step S5 includes forming the electron blocking layer 180 and the semiconductor layer 150A over the active layer 130 and the index matching layer 140 by means of epitaxial growth.

Figure 5:
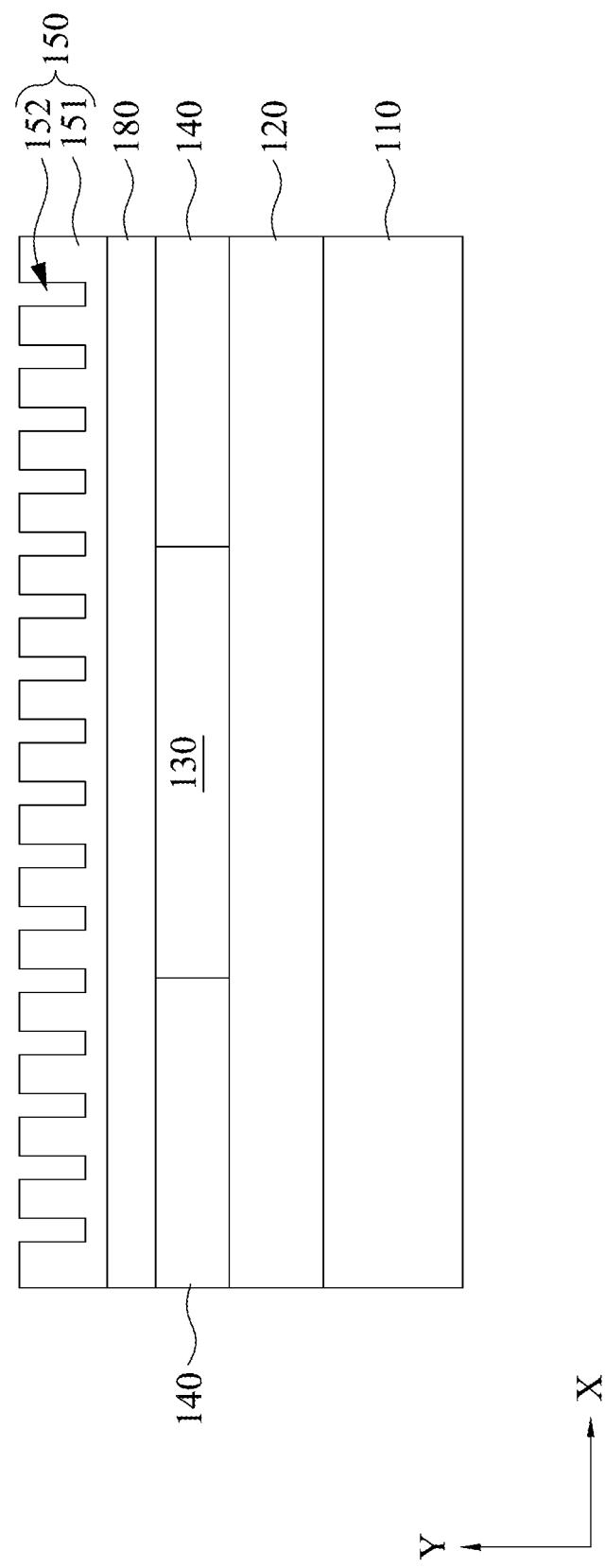

As shown in FIG. 5, the method for manufacturing the photonic crystal surface-emitting laser 100 continues to step S7, which includes forming the photonic crystal structure 150 in the semiconductor layer 150A. In some embodiments, step S7 includes removing part of the semiconductor layer 150A to form the periodic holes 152 of the photonic crystal structure 150. The remaining part of the semiconductor layer 150A becomes the base portion 151 of the photonic crystal structure 150. In some embodiments, step S7 includes removing part of the semiconductor layer 150A to form the periodic holes 152 of the photonic crystal structure 150 by means of etching or lithography.

Figure 6:
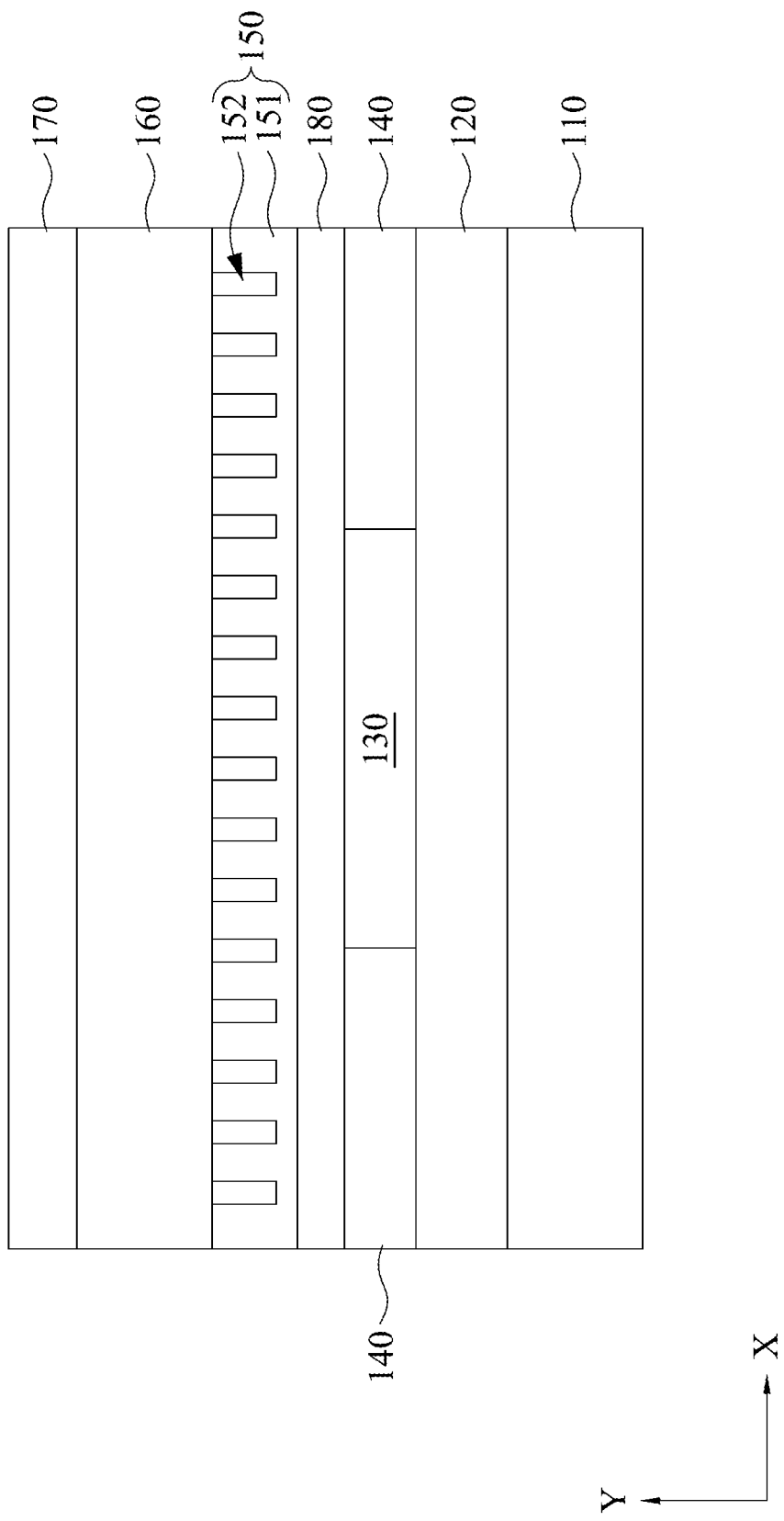

As shown in FIG. 6, the method for manufacturing the photonic crystal surface-emitting laser 100 continues to step S9, which includes forming the p-type cladding layer 160 and the second substrate 170 (e.g., p-GaAs) over the photonic crystal structure 150. The p-type cladding layer 160 and the second substrate 170 are in a stack arrangement along the first direction Y. The second substrate 170 covers a top surface of the p-type cladding layer 160. In some embodiments, step S9 includes forming the p-type cladding layer 160 and the second substrate 170 over the photonic crystal structure 150 by means of epitaxial growth.

Returning to FIG. 1C, the method for manufacturing the photonic crystal surface-emitting laser 100 concludes at step S11, which includes forming the first and second electrodes 101 and 102. The first electrode 101 is disposed on the side of the first substrate 110 away from the n-type cladding layer 120, and the first electrode 101 is in contact with the surface of the first substrate 110 away from the n-type cladding layer 120. The second electrode 102 is disposed on the side of the second substrate 170 away from the p-type cladding layer 160, and the second electrode 102 is in contact with the surface of the second substrate 170 away from the p-type cladding layer 160. In some embodiments, step S11 includes depositing the first electrode 101 on the surface of the first substrate 110 away from the n-type cladding layer 120, and depositing the second electrode 102 on the surface of the second substrate 170 away from the p-type cladding layer 160.

Figure 7:
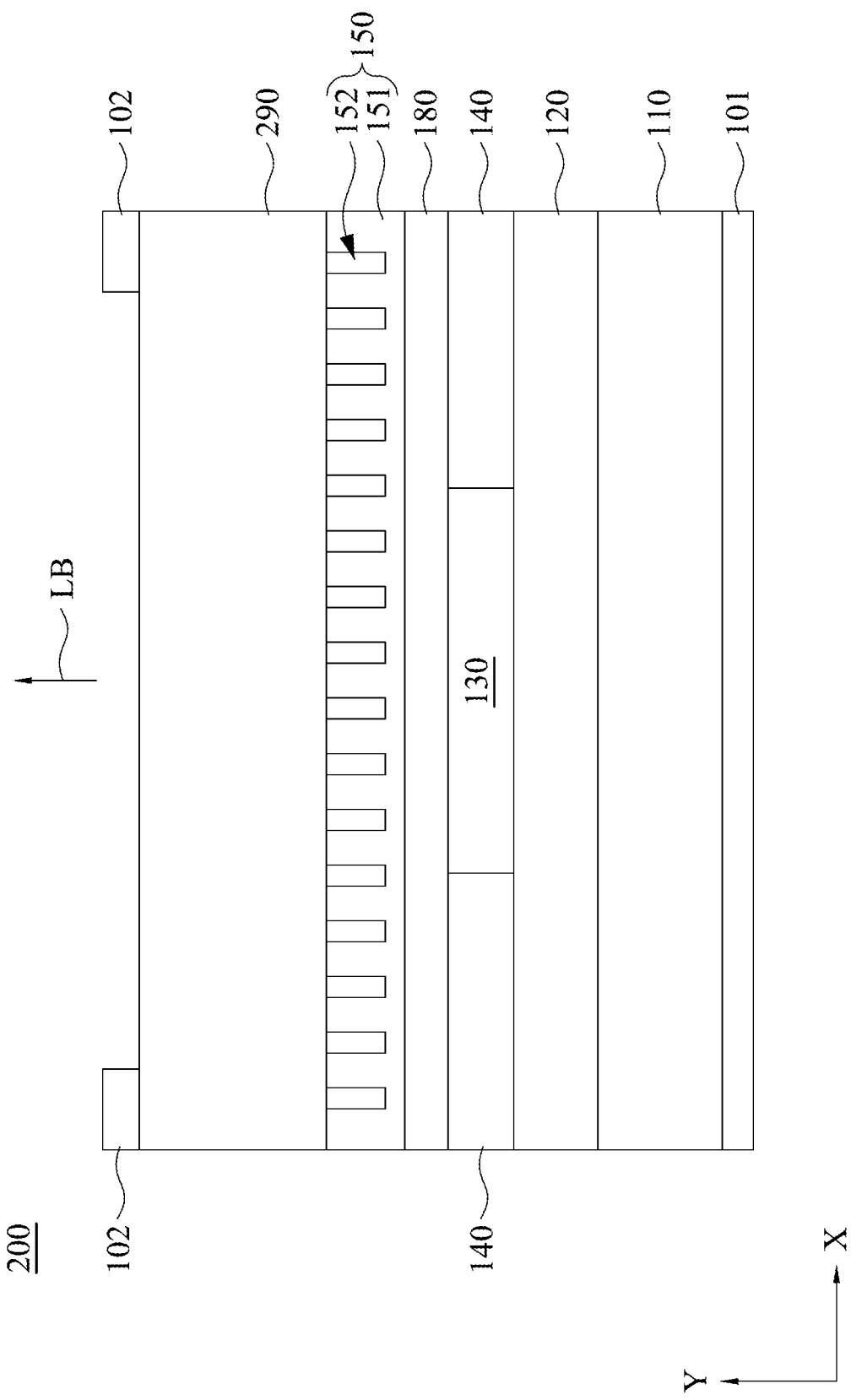
FIG. 7 illustrates a sectional view of a photonic crystal surface-emitting laser in accordance with another embodiment of the present disclosure.

Reference is made to FIG. 7, which illustrates a sectional view of a photonic crystal surface-emitting laser 200 in accordance with another embodiment of the present disclosure. Compared to the embodiment shown in FIG. 1C, the photonic crystal surface-emitting laser 200 of the present embodiment includes a transparent conductive layer 290 to replace the p-type cladding layer 160 and the second substrate 170. The transparent conductive layer 290 covers a side of the photonic crystal structure 150 away from the active layer 130. The second electrode 102 is disposed over the transparent conductive layer 290, and the second electrode 102 is in contact with a surface of the transparent conductive layer 290 away from the photonic crystal structure 150.

In some embodiments, a method for manufacturing the photonic crystal surface-emitting laser 200 includes: after forming the photonic crystal structure 150, coating the transparent conductive layer 290 on the side of the photonic crystal structure 150 away from the active layer 130.

In some embodiments, the transparent conductive layer 290 includes ITO, ZnO, AlGaInSnO, AZO, $SnO_2$, $In_2O_3$, SnZnO, graphene, other suitable electrically conductive material, or any combination thereof. These materials have decent transmissivity in the visible spectrum and the infrared region, and can thus facilitate the output of the light beam LB.

In sum, the photonic crystal surface-emitting laser of the present disclosure includes an index matching layer arranged around the active layer. The index matching layer is electrically insulating, and an effective refractive index of the index matching layer is substantially identical to an effective refractive index of the active layer. By this arrangement, the photonic crystal surface-emitting laser of the present disclosure can have smaller divergence angle and smaller threshold current.

Although the present disclosure has been described by way of the exemplary embodiments above, the present disclosure is not to be limited to those embodiments. Any person skilled in the art can make various changes and modifications without departing from the spirit and the scope of the present disclosure. Therefore, the protective scope of the present disclosure shall be the scope of the claims as attached.

What is claimed is:

1. A photonic crystal surface-emitting laser, comprising:
    a first substrate;
    an n-type cladding layer disposed over the first substrate;
    an active layer disposed over the n-type cladding layer;
    an index matching layer disposed over the n-type cladding layer and being arranged around the active layer, wherein the index matching layer is electrically insulating, and an effective refractive index of the index matching layer is substantially identical to an effective refractive index of the active layer; and
    a photonic crystal structure disposed over the active layer and the index matching layer.

2. The photonic crystal surface-emitting laser of claim 1, wherein the index matching layer is transparent to light emitted by the active layer.

3. The photonic crystal surface-emitting laser of claim 1, wherein a lateral length of the active layer is smaller than a lateral length of the photonic crystal structure.

4. The photonic crystal surface-emitting laser of claim 1, wherein a cross-sectional area of the active layer is smaller than a cross-sectional area of the photonic crystal structure.

5. The photonic crystal surface-emitting laser of claim 1, wherein the active layer is located in an orthogonal projection area of the photonic crystal structure onto the n-type cladding layer.

6. The photonic crystal surface-emitting laser of claim 1, wherein the index matching layer is at least partially located in an orthogonal projection area of the photonic crystal structure onto the n-type cladding layer.

7. The photonic crystal surface-emitting laser of claim 1, wherein a lateral length of the active layer is within a range from 6 to 10 micrometers.

8. The photonic crystal surface-emitting laser of claim 1, wherein the index matching layer is in contact with a side surface of the active layer.

9. The photonic crystal surface-emitting laser of claim 8, wherein the active layer further has a top surface and a bottom surface, the top surface faces the photonic crystal structure, the bottom surface faces the n-type cladding layer, the side surface is connected between the top surface and the bottom surface, and the index matching layer is spaced apart from the top surface and the bottom surface of the active layer.

10. The photonic crystal surface-emitting laser of claim 1, wherein the active layer is cylindrical.

11. The photonic crystal surface-emitting laser of claim 1, further comprising an electron blocking layer disposed over the active layer and the index matching layer.

12. The photonic crystal surface-emitting laser of claim 1, further comprising a p-type cladding layer and a second substrate, wherein the p-type cladding layer is disposed over the photonic crystal structure, and the second substrate is disposed over the p-type cladding layer.

13. The photonic crystal surface-emitting laser of claim 12, further comprising a metal electrode, wherein the metal electrode is disposed on a side of the second substrate away from the p-type cladding layer, and the metal electrode is in contact with a surface of the second substrate away from the p-type cladding layer.

14. The photonic crystal surface-emitting laser of claim 1, further comprising a transparent conductive layer disposed over the photonic crystal structure.

15. The photonic crystal surface-emitting laser of claim 14, further comprising a metal electrode, wherein the metal electrode is disposed on a side of the transparent conductive layer away from the photonic crystal structure, and the metal electrode is in contact with a surface of the transparent conductive layer away from the photonic crystal structure.

16. The photonic crystal surface-emitting laser of claim 1, further comprising a metal electrode, wherein the metal electrode is disposed on a side of the first substrate away from the n-type cladding layer, and the metal electrode is in contact with a surface of the first substrate away from the n-type cladding layer.

17. The photonic crystal surface-emitting laser of claim 1, wherein the photonic crystal structure comprises a plurality of periodic holes.

18. The photonic crystal surface-emitting laser of claim 17, wherein the first substrate, the n-type cladding layer and the active layer are arranged along a direction, and the periodic holes are arranged on a plane normal to the direction.

19. The photonic crystal surface-emitting laser of claim 17, wherein the periodic holes have circular, quadrangular or hexagonal cross-sections.

20. The photonic crystal surface-emitting laser of claim 1, wherein the active layer comprises quantum well.

* * * * *